United States Patent
Chen et al.

(10) Patent No.: US 8,497,536 B2
(45) Date of Patent: Jul. 30, 2013

(54) DUAL-FACING CAMERA ASSEMBLY

(75) Inventors: Gang Chen, San Jose, CA (US); Ashish Shah, Milpitas, CA (US); Duli Mao, Sunnyvale, CA (US); Hsin-Chih Tai, San Jose, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 67 days.

(21) Appl. No.: 13/235,121

(22) Filed: Sep. 16, 2011

(65) Prior Publication Data

US 2013/0069188 A1  Mar. 21, 2013

(51) Int. Cl.
*H01L 31/062* (2006.01)
*H01L 31/113* (2006.01)

(52) U.S. Cl.
USPC ........... 257/293; 257/59; 257/72; 257/228; 257/292; 257/E21.053; 257/E21.183; 257/E21.185; 257/E21.352; 257/E21.527

(58) Field of Classification Search
USPC ............ 257/293, 294, 292, 290, 288, 186, 257/228, 59, 72, E21.053, E21.183, E21.185, 257/E21.189, E21.352, E21.527
See application file for complete search history.

(56) References Cited

U.S. PATENT DOCUMENTS

| | | | |
|---|---|---|---|
| 6,898,030 B1 * | 5/2005 | Lin et al. | 359/819 |
| 7,379,113 B2 * | 5/2008 | Kong et al. | 359/819 |
| 7,422,382 B2 * | 9/2008 | Seo | 396/529 |
| 7,484,901 B2 * | 2/2009 | Seo et al. | 396/529 |
| 7,539,412 B2 | 5/2009 | Lee et al. | |

* cited by examiner

*Primary Examiner* — David Nhu
(74) *Attorney, Agent, or Firm* — Blakely Sokoloff Taylor & Zafman LLP

(57) ABSTRACT

Embodiments of the invention relate to a camera assembly including a rear-facing camera and a front-facing camera operatively coupled together (e.g., bonded, stacked on a common substrate).

In some embodiments of the invention, a system having an array of frontside illuminated (FSI) imaging pixels is bonded to a system having an array of backside illuminated (BSI) imaging pixels, creating a camera assembly with a minimal size (e.g., a reduced thickness compared to prior art solutions). An FSI image sensor wafer may be used as a handle wafer for a BSI image sensor wafer when it is thinned, thereby decreasing the thickness of the overall camera module. According to other embodiments of the invention, two package dies, one a BSI image sensor, the other an FSI image sensor, are stacked on a common substrate such as a printed circuit board, and are operatively coupled together via redistribution layers.

15 Claims, 10 Drawing Sheets

DUAL-FACING CAMERA ASSEMBLY

TECHNICAL FIELD

The present invention generally relates generally to image sensors, and in particular, but not exclusively, relates to camera modules including a rear facing camera and a front facing camera.

BACKGROUND INFORMATION

Mobile electronic devices with image capture abilities, such as cellular telephones, are becoming increasingly popular. Some mobile devices are capable of capturing image data from two directions (e.g., from the "front" and "rear" sides of the device).

Some devices achieve this capability by manually moving an image capture system included in the device—e.g., rotating the image capture system to capture image data from a selected side; however, this solution requires the use of mechanical means such as hinges which increases the complexity and cost of the mobile electronic device. Other devices include two camera modules on opposing sides. Current implementations of these solutions significantly increase the size of the devices, making these solutions undesirable.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an apparatus, system and method for utilizing and creating a dual-facing camera assembly are described herein. In the following description numerous specific details are set forth to provide a thorough understanding of the embodiment. One skilled in the relevant art will recognize however, that the techniques described herein can be practiced without one or more of the specific details, components, materials, etc. In other instances, well-known structure, materials or operations are not shown or described in detail to avoid obscuring certain aspects.

References throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. Directional terminology such as top, bottom, over and under are used with reference to the orientation of the figure(s) being described, but should not be interpreted as any kind of limitation on the orientation of the embodiment.

Figure 1:
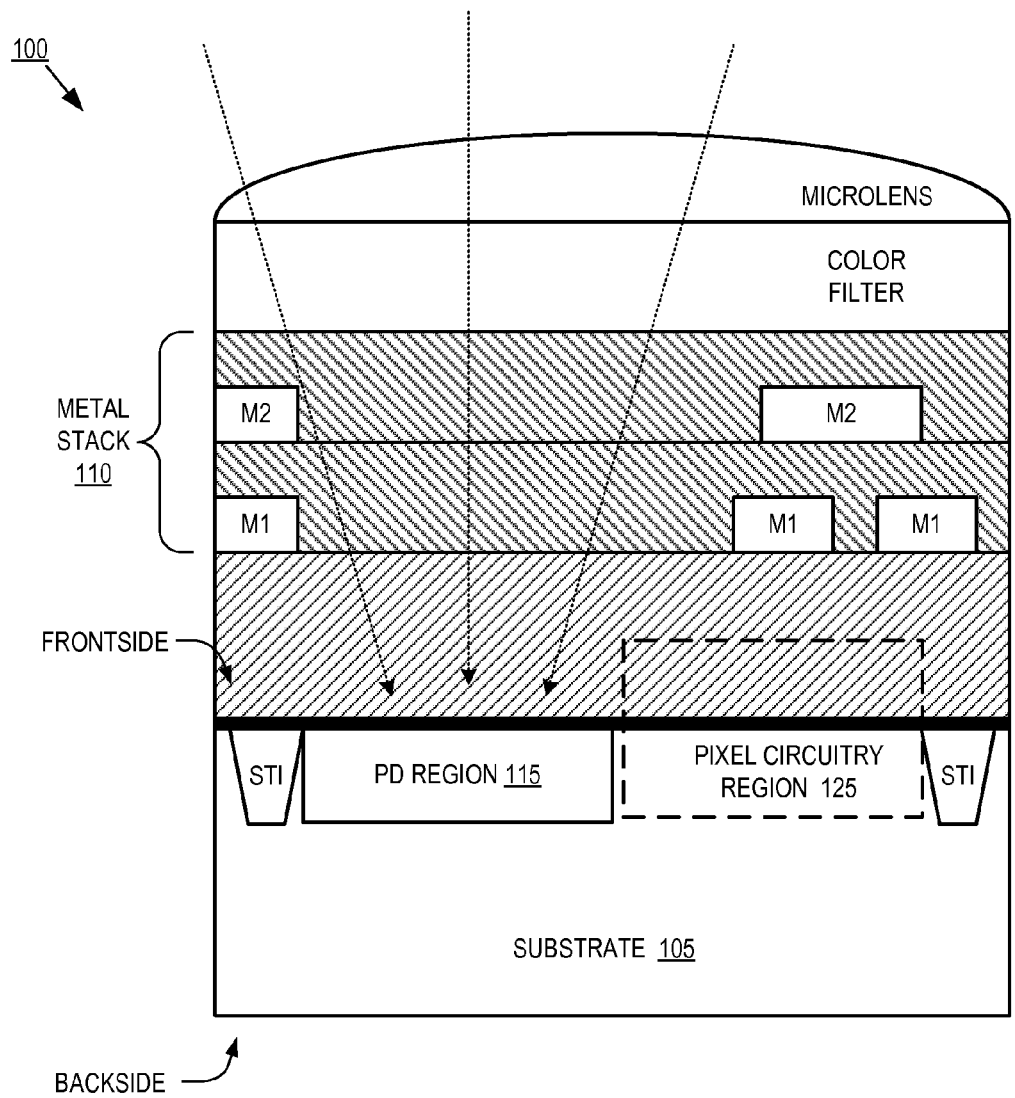
FIG. 1 illustrates an FSI complementary metal-oxide-semiconductor ("CMOS") imaging pixel according to an embodiment of the disclosure.

FIG. 1 illustrates an FSI complementary metal-oxide-semiconductor ("CMOS") imaging pixel according to an embodiment of the disclosure. The frontside of imaging pixel 100 is the side of substrate 105 upon which the pixel circuitry is disposed and over which metal stack 110 for redistributing signals is formed. The metal layers (e.g., metal layer M1 and M2) are patterned in such a manner as to create an optical passage through which light incident on the frontside of imaging pixel 100 can reach the photosensitive or photodiode ("PD") region 115. The frontside may further include a color filter layer to implement a color sensor and a microlens to focus the light onto PD region 115.

In this embodiment, imaging pixel 100 includes pixel circuitry disposed within pixel circuitry region 125 adjacent to PD region 115. This pixel circuitry provides a variety of functionality for regular operation of imaging pixel 100. For example, pixel circuitry region 125 may include circuitry to commence acquisition of an image charge within PD region 115, to reset the image charge accumulated within PD region 115 to ready imaging pixel 100 for the next image, or to transfer out the image data acquired by imaging pixel 100. As illustrated, in this example of a frontside illuminated configuration, pixel circuitry region 125 is positioned immediately adjacent to PD region 115.

Figure 2:
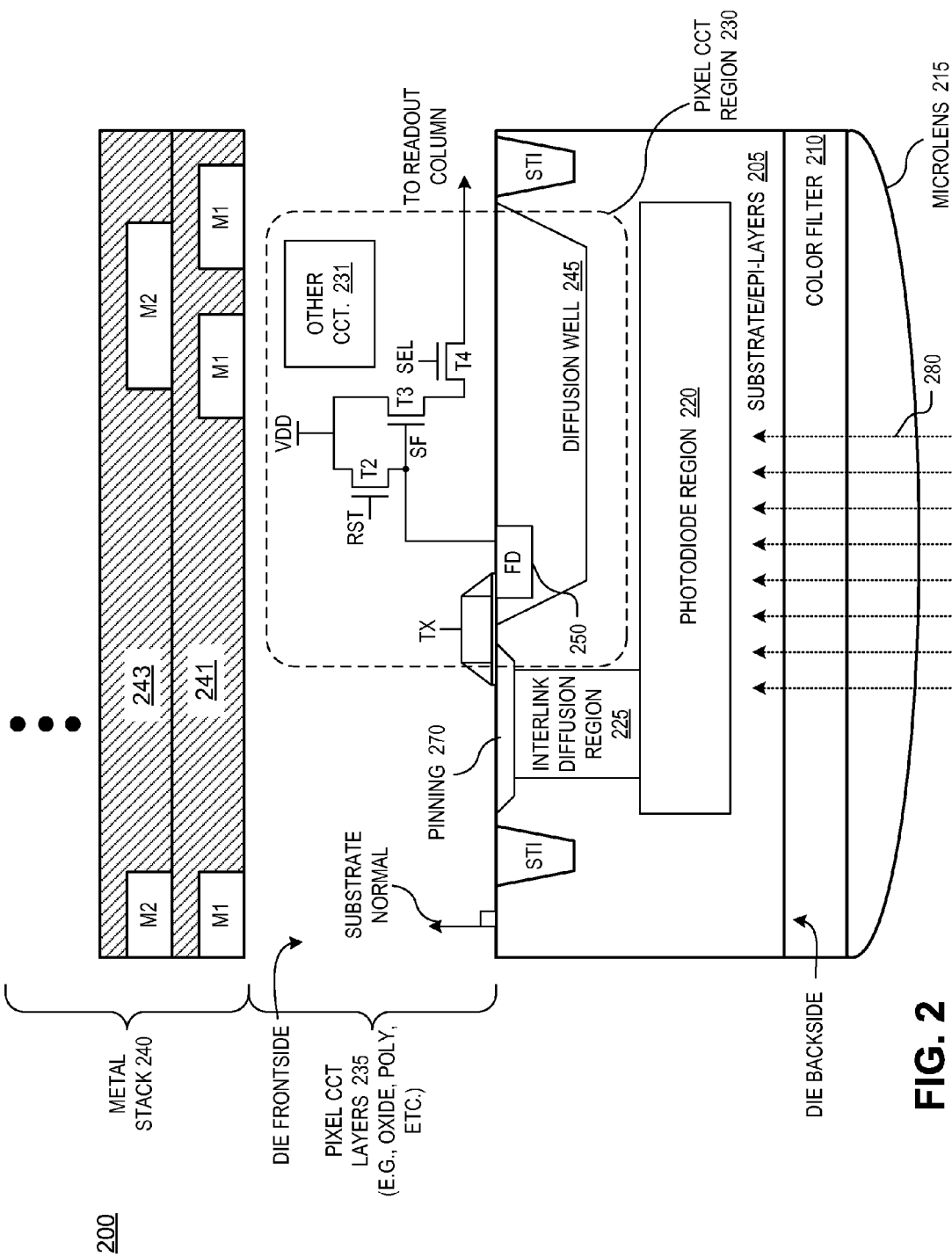
FIG. 2 is a hybrid cross sectional/circuit illustration of a BSI imaging pixel according to an embodiment of the disclosure.

FIG. 2 is a hybrid cross sectional/circuit illustration of a BSI imaging pixel according to an embodiment of the disclosure. In the illustrated embodiment, BSI imaging pixel 200 includes substrate 205, color filter 210, microlens 215, PD region 220, interlinking diffusion region 225, pixel circuitry region 230, pixel circuitry layers 235, and a metal stack 240. The illustrated embodiment of pixel circuitry region 230 includes a 4T pixel (other pixel designs may be substituted), as well as other circuitry 231 (e.g., gain circuitry, ADC circuitry, gamma control circuitry, exposure control circuitry, etc.), disposed over a diffusion well 245.

In this embodiment, floating diffusion 250 is disposed within diffusion well 245 and coupled between transfer transistor T1 and the gate of SF transistor T3. The illustrated embodiment of metal stack 240 includes two metal layers M1 and M2 separated by intermetal dielectric layers 241 and 243. Although FIG. 2 illustrates only a two layer metal stack, metal stack 240 may include more or less layers for routing signals over the frontside of imaging pixel 200. In one embodiment, a passivation or pinning layer 240 is disposed over interlinking diffusion region 225. Finally, shallow trench isolations ("STI") isolate BSI imaging pixel 200 from adjacent pixels (not illustrated).

As illustrated, imaging pixel 200 is photosensitive to light 280 incident on the backside of its semiconductor die. By using a backside illuminated sensor, pixel circuitry region 230 may be positioned in an overlapping configuration with photodiode region 220. In other words, pixel circuitry can be placed adjacent to interlinking diffusion region 225 and between photodiode region 220 and the die frontside without obstructing light 280 from reaching photodiode region 220. By placing the pixel circuitry in an overlapping configuration with photodiode region 220, as opposed to side-by-side configuration as illustrated in the FSI imaging pixel of FIG. 1, photodiode region 220 no longer competes for valuable die real estate with the pixel circuitry. Rather, pixel circuitry region 220 can be enlarged to accommodate additional or larger components without detracting from the fill factor of the image sensor. BSI imaging pixel 200 further enables other circuits 231, such as gain control or ADC circuitry, to be placed in close proximity to their respective photodiode region 220 without decreasing the sensitivity of the pixel. By inserting gain control and ADC circuitry in close proximity to each PD region 220, circuit noise can be reduced and noise immunity improved due to shorter electrical interconnections between PD region 220 and the additional in-pixel circuitry. Furthermore, the backside illumination configuration of the illustrated embodiment provides greater flexibility to route signals over the frontside of imaging pixel 200 within metal stack 240 without interfering with light 280. In one embodiment, a shutter signal is routed within metal stack 240 to the pixels of a BSI imaging array (including pixel 200).

In one embodiment, pixel circuit regions 230 over PD regions 220 of adjacent pixels within a BSI pixel array can be grouped to create communal die real estate. This communal die real estate can support shared circuitry (or inter-pixel circuitry) in addition to the basic 3T, 4T, 5T, etc. pixel circuitry. Alternatively, some pixels can share their unused die real estate above their PD regions to an adjacent pixel requiring additional pixel circuitry space for larger or more advanced in-pixel circuitry. Accordingly, in some embodiments, other circuitry 231 may overlap two or more PD regions 220 and may even be shared by one or more pixels.

In one embodiment, substrate 205 is doped with P type dopants. In this case, substrate 205 and the epitaxial layers grown thereon may be referred to as a P substrate. In a P type substrate embodiment, diffusion well 245 is a P+ well implant while photodiode region 220, interlinking diffusion region 225, and floating diffusion 250 are N type doped. Floating diffusion 250 is doped with an opposite conductivity type dopant as diffusion well 245 to generate a p-n junction within diffusion well 245, thereby electrically isolating floating diffusion 250. In an embodiment where substrate 205 and the epitaxial layers thereon are N type, diffusion well 245 is also N type doped, while photodiode region 220, interlinking diffusion region 225, and floating diffusion 250 have an opposite P type conductivity.

Figure 3:
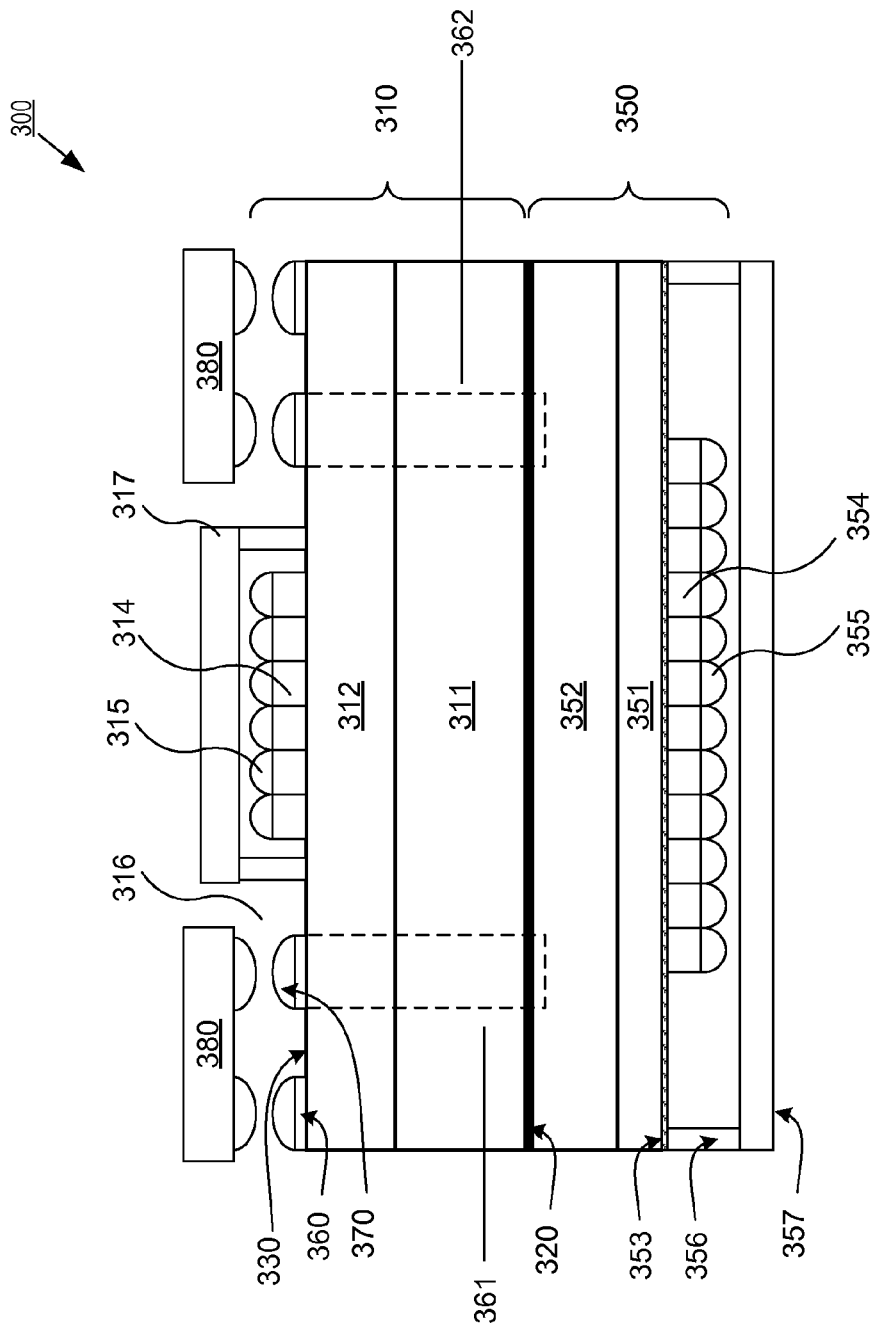
FIG. 3 is a cross-section view of a dual-facing camera assembly according to an embodiment of the disclosure.

FIG. 3 is a cross-section view of a dual-facing camera assembly according to an embodiment of the disclosure. In this embodiment, dual-facing camera assembly 300 includes first imaging system 310 and second imaging system 350. First imaging system 310 includes array of FSI imaging pixels. Each pixel of said array is formed from substrate 311 and metal stack 312. For example, each pixel of the FSI array may have a PD region formed in substrate 311 that receives light that passes through metal stack 312, similar to FSI imaging pixel 100 shown in FIG. 1. Furthermore, each pixel of the FSI array may utilize a corresponding color filter 314 and microlens 315. First imaging system 310 further includes adhesive glue 316 and cover glass 317 disposed over said microlenses.

Second imaging system 350 includes array of BSI imaging pixels 305. Each pixel of said array is formed from substrate 351 and metal stack 352. For example, each pixel of the BSI array may have a PD region formed in substrate 351 and disposed between metal stack 352 and backside p+ layer 353, similar to the BSI imaging pixel shown in FIG. 2. Furthermore, each pixel may utilize a corresponding color filter 354 and microlens 355. Second imaging system 350 further includes adhesive glue 356 and cover glass 357 disposed over said microlenses.

In this embodiment, bottom side of first imaging system 310 is bonded to the topside of second imaging system 350 via bonding layer 320. Thus, electromagnetic radiation incident to opposing sides of dual-facing camera assembly 300 is incident to the photosensitive region of one of the arrays of image sensors. Furthermore, as described above, BSI imaging pixels may include pixel circuitry placed in an overlapping configuration with its photodiode region, as opposed to the side-by-side configurations FSI imaging pixels; thus the pixel circuitry regions of BSI imaging pixels can be enlarged to accommodate additional or larger components without detracting from the fill factor of the image sensor. Therefore in some embodiments, BSI imaging system 350 is capable of capturing image data with a higher image resolution compared to FSI imaging system 310.

The redistribution layer ("RDL") for BSI image sensor 350 may be achieved with chip scale packing ("CSP") or thru-silicon via ("TSV") process to make metal stack 352 of second imaging system 350 assessable to metal pads 360. In one embodiment, metal pads 360 are deposited onto the front side of semiconductor substrate 312 by way of sputtering, collimated sputtering, low pressure sputtering, reactive sputtering, electroplating, chemical vapor deposition or evaporation or any functionally equivalent process known in the art. Metal pads 360 provide access for substrate 380 to the imaging data captured by imaging systems 310 and 350.

In this embodiment, TSVs 361 and 362 are formed through metal stack 312 and substrate 311 to operatively couple metal layer 352 to metal pads 360. In this embodiment, metal stack 312 and substrate 311 in the region that is not direct under cover glass 317 may be used in the TSV process since the substrate and metal stack area taken up by FSI pixel array 311 is found in the region under cover glass 317.

Figure 4:
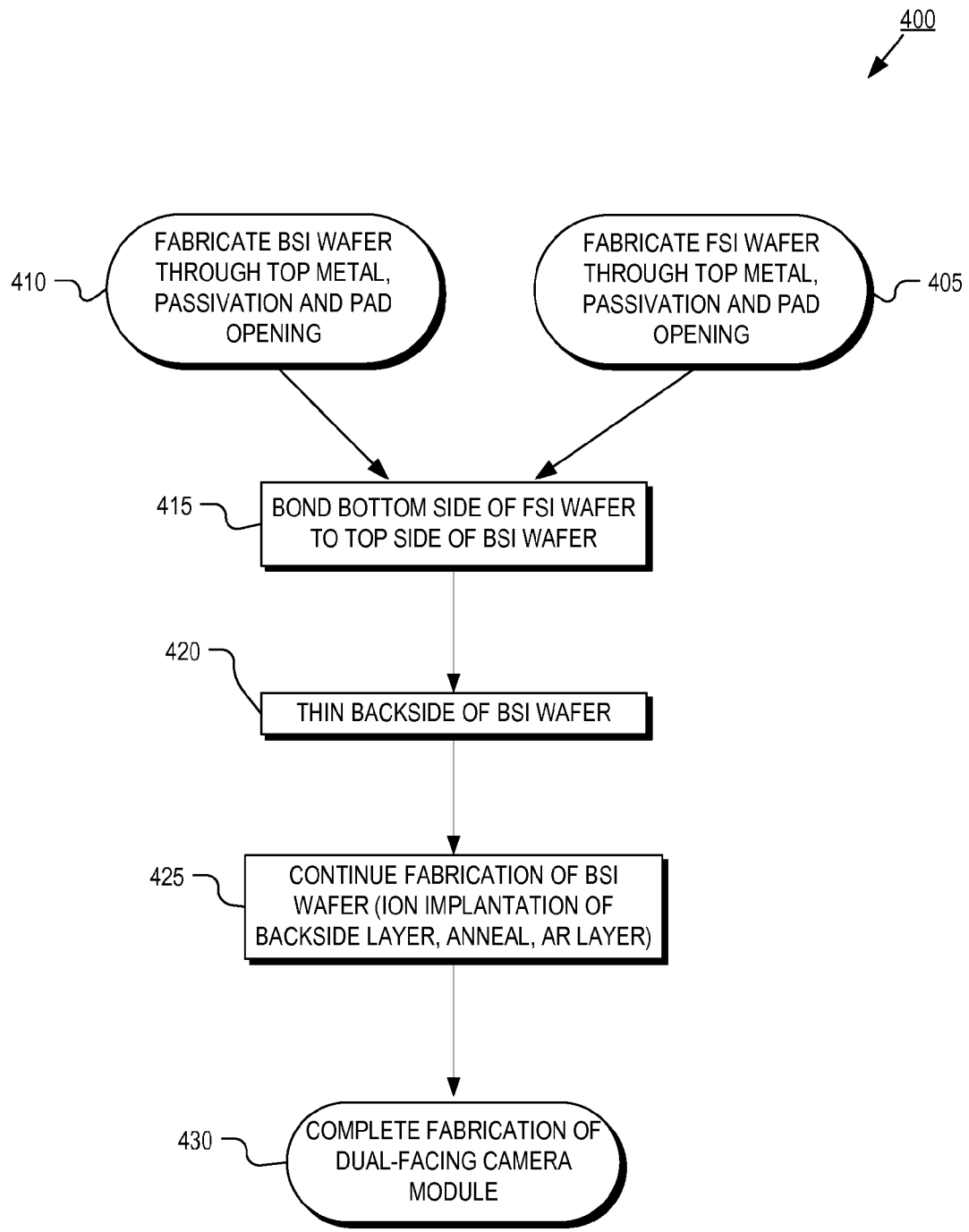
FIG. 4 is a flow chart illustrating a process for fabricating a dual-facing camera assembly according to an embodiment of the disclosure.

FIG. 4 is a flow chart illustrating a process for fabricating a dual-facing camera assembly according to an embodiment of the disclosure. Flow diagrams as illustrated herein provide examples of sequences of various process actions. Although shown in a particular sequence or order, unless otherwise specified, the order of the actions can be modified. Thus, the illustrated implementations should be understood only as examples, and the illustrated processes can be performed in a different order, and some actions may be performed in parallel. Additionally, one or more actions can be omitted in various embodiments of the invention; thus, not all actions are required in every implementation. Other process flows are possible.

FIG. 5A-FIG. 5D are block diagrams of image wafers forming a dual camera assembly according to an embodiment of the disclosure, and are to be viewed in the context of the process flow shown in FIG. 4.

In process block 405, the fabrication of an FSI image sensor may comprise conventional techniques right up to the fabrication of the back-end-of-the-line ("BEOL") components including diffusion implants, silicides, pixel transistor circuitry and metal stack.

Figure 5A:
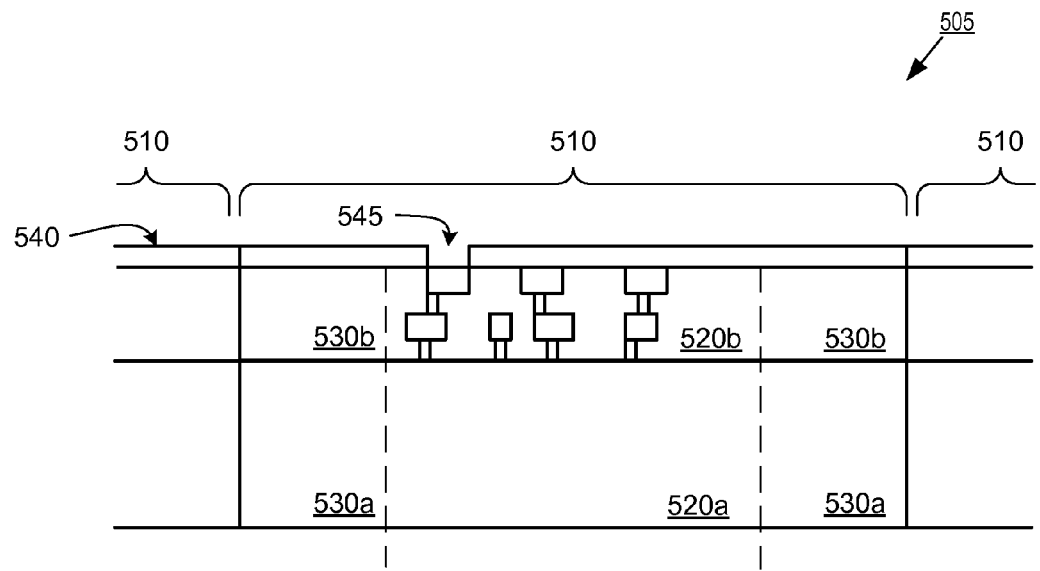
FIG. 5A-FIG. 5D are block diagrams of image wafers forming a dual camera assembly according to an embodiment of the disclosure.

FIG. 5A is an illustration of fabricated FSI image sensor wafer 505. Region 510 comprises FSI image sensor regions 520a-b and unused regions 530a-b. The passive and active semiconductor elements in an image sensor, such as the CMOS transistors found in the pixel array, readout circuitry and other circuits are fabricated in substrate region 520a. Metal stack 520b is fabricated over substrate 520a. In this embodiment, no semiconductor elements are formed in substrate region 520b. Unused regions 530a-b may include dielectric layers. Passivation layer 540 is formed over metal stack 520*b*, with passivation opening 545 formed to expose metal pads on the top metal interconnect layer. In other embodiments, passivation layer 540 is omitted.

The illustrated embodiment of metal stack 520*b* includes two metal interconnect layers separated by intermetal dielectric layers. Although FIG. 5A illustrates a two-layer metal stack, metal stack 520*b* may include more or less metal interconnect layers for routing signals above the top side of substrate 520*a*. In one embodiment of the invention, the metal interconnect layers comprises a metal such as aluminum, copper, or other alloy. In one embodiment of the invention, metal interconnect layers are formed by way of sputtering, collimated sputtering, low pressure sputtering, reactive sputtering, electroplating, chemical vapor deposition or evaporation.

In process block 410 of FIG. 4, the fabrication of a BSI image sensor die may comprise conventional techniques right up to the fabrication of the BEOL components including diffusion implants, silicides, pixel transistor circuitry and metal stack.

Figure 5B:
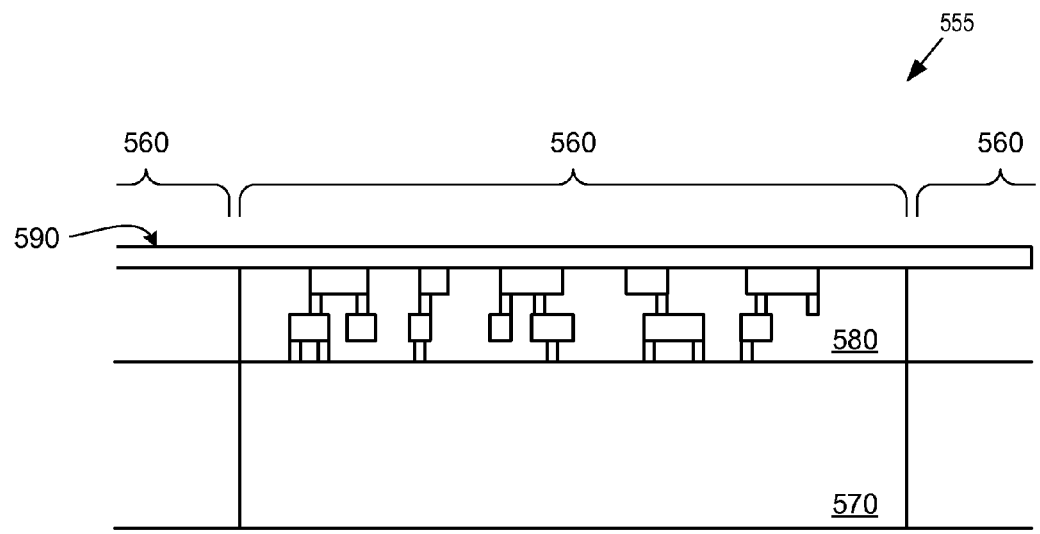

FIG. 5B is an illustration of fabricated BSI image wafer 555. In this embodiment, region 510 in FIG. 5A, which comprises FSI image sensor die 520 and unused regions 530 is relatively the same size as BSI image sensor die 560, so that when FSI image sensor wafer 505 and BSI image sensor wafer 555 are bonded together, the physical center of FSI image sensor die 520 lines up with the physical center of BSI image sensor 560.

The passive and active semiconductor elements of the image sensor, such as the CMOS transistors found in the pixel array, readout circuitry and other circuits are fabricated in substrate 570. Metal stack 580 is formed on top of substrate 570. In the illustrated embodiment, metal stack 580 includes two metal interconnect layers separated by intermetal dielectric layers. Passivation 590 is formed over metal stack 580. In other embodiments, passivation 590 is omitted.

In the present embodiment, the passive and active elements of FSI image sensor die 520 and BSI image sensor die 560 are formed in substrate 520 and 570 respectively. In other embodiments of the invention semiconductor elements of FSI image sensor die 510 and BSI image sensor die 560 may be formed in an epitaxial layer. In yet other embodiments of the invention, semiconductor elements of FSI image sensor die 510 and BSI image sensor die 560 may be formed in an epitaxial layer with a substrate layer formed under said epitaxial layer.

Figure 5C:
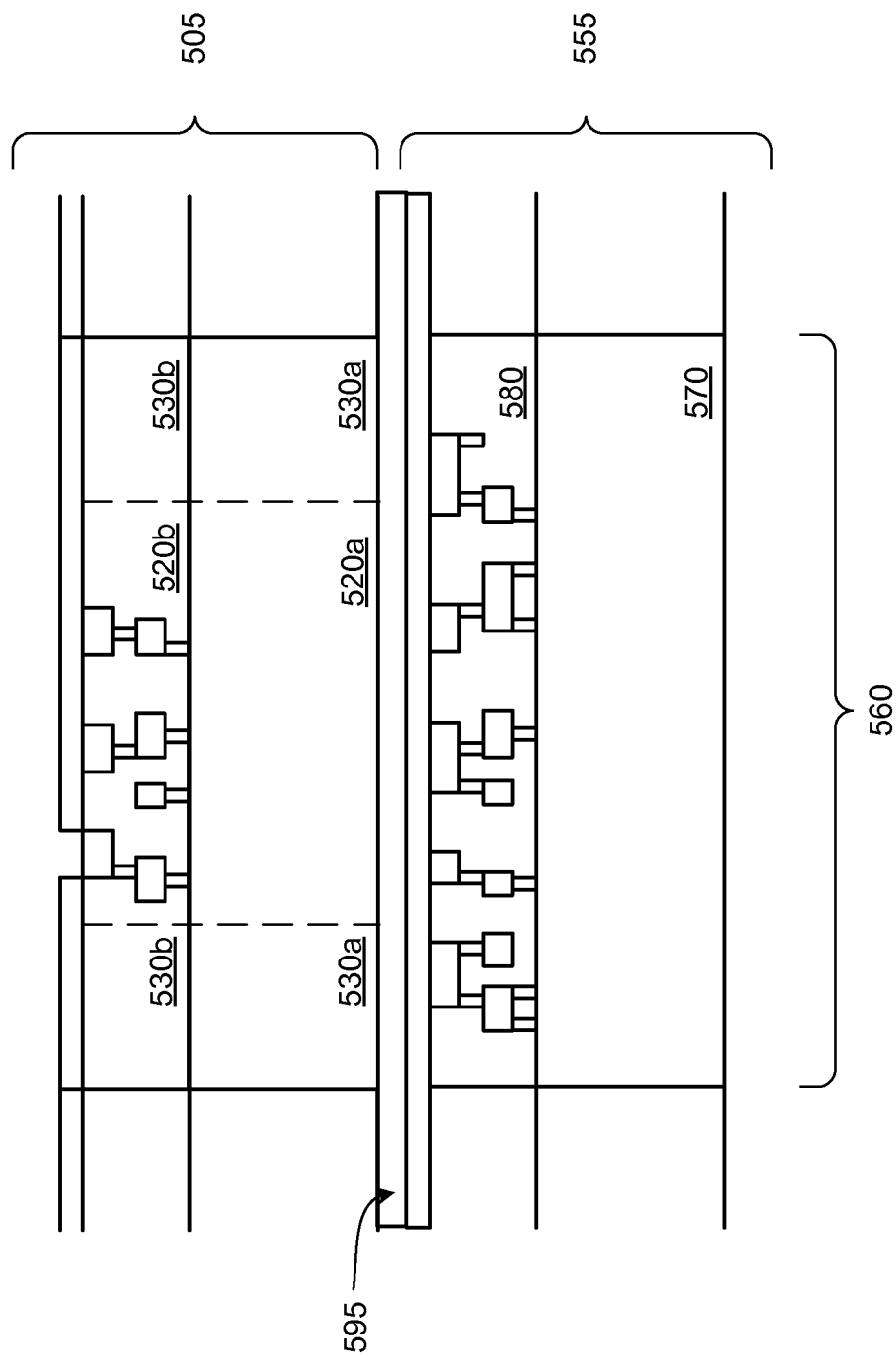

In process block 415 of FIG. 4, the bottom side of the FSI image sensor wafer is bonded to the top side of the BSI image sensor wafer using a bonding oxide. Thus, as shown in FIG. 5C, the bottom side of FSI image sensor wafer 505 is bonded to the top side of BSI image sensor wafer 555 using bonding oxide 595. The size of BSI image sensor die 560 is approximately the same size as FSI image sensor die 520 and unused regions 530. FSI image sensor die 520 and unused regions 530 are positioned so that the physical center of FSI image sensor die 520 lines up with the physical center of BSI image sensor die 560 after both wafers are bonded together. In one embodiment, at this stage of processing FSI image sensor wafer 505 and BSI image sensor wafer 555 each have the same thickness (e.g., approximately 400 μm).

Figure 5D:
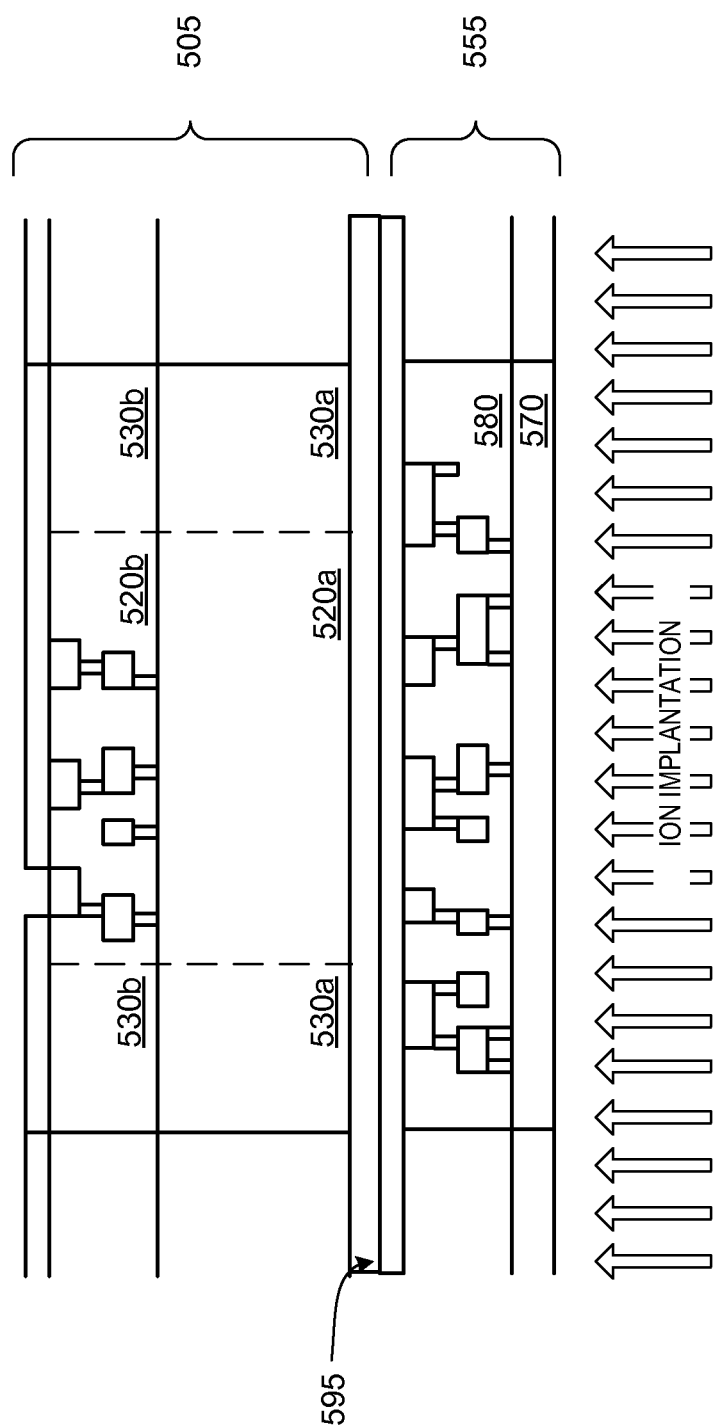

In process block 420, the backside of the BSI wafer is thinned via known methods such as chemical-mechanical planarization. The thinning of the backside of substrate 570 is shown in FIG. 5D. In this embodiment, FSI image sensor wafer 505 acts as the handling wafer for BSI image sensor wafer 555, thus a separate handling wafer is not necessary (a handle wafer is used as a handle to hold a partially fabricated imaging pixel array while thinning its backside). Thus, BSI image sensor wafer 555 will have a thickness that is less than that of FSI image wafer.

In process block 425, ion implantation of backside p+ layer and annealing, and deposition of an anti-reflective coating is executed. As shown in FIG. 5D, backside p+ layer of substrate 570 is a p-type layer; in other embodiments of the invention, said backside layer may be an n-type layer or may be omitted.

In process block 430, the fabrication of dual-facing camera assembly is complete by forming color filters and microlenses for both image sensor dies, forming protective packaging on each image sensor die and dies sawing the bonded FSI and BSI image sensor wafers. In some embodiments of the invention, both image sensors are subject to a deposition of an anti-reflective coating. The anti-reflective coating may be omitted in other embodiments of the invention. In other embodiments of the invention, the anti-reflective coating may be omitted. Protective tape may be placed over the top side of FSI image sensor wafer 505 to protect the top metal interconnect layer.

Figure 6A:
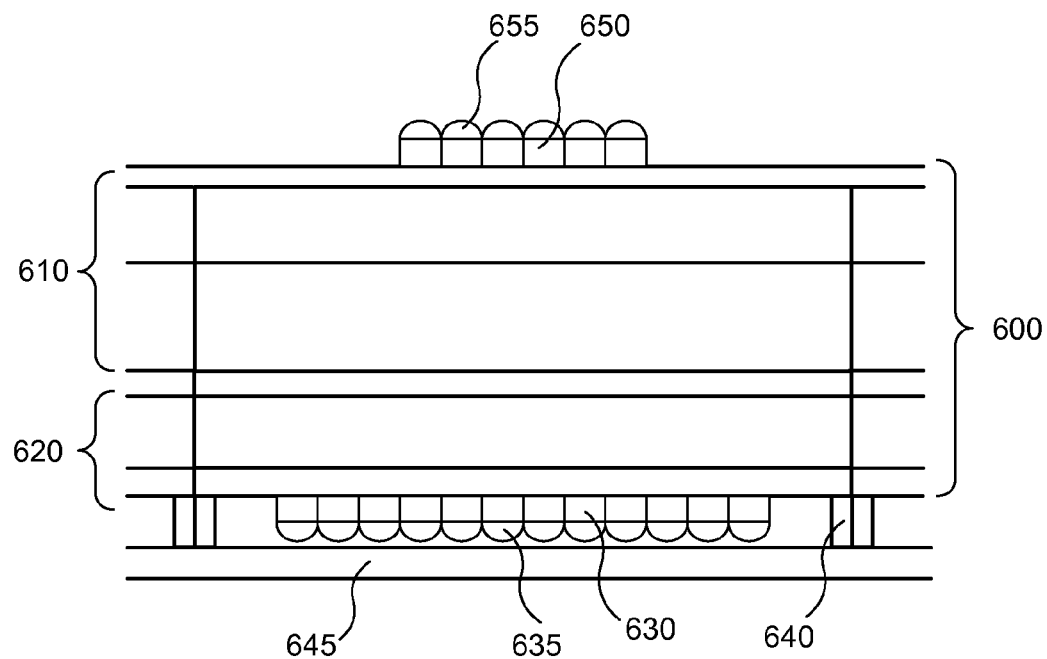
FIG. 6A-FIG. 6D illustrate processing operations for packaging a dual-facing camera assembly according to an embodiment of the disclosure.

FIG. 6A-FIG. 6D illustrate processing operations for packaging a dual-facing camera assembly according to an embodiment of the disclosure. FIG. 6A is a cross-section view illustrating dual-facing image sensor 600 including FSI image sensor wafer 610 bonded to BSI image sensor wafer 620.

Color filters 650 are formed over each FSI image sensor pixel in FSI image sensor wafer 610. Microlenses 655 are formed over color filters 650. Color filters 630 are formed over each BSI image sensor pixel in BSI image sensor wafer 620. Microlenses 635 are formed over color filters 630. FIG. 6A illustrates that BSI image wafer 620 has more "pixels" than FSI image wafer 610—i.e., BSI image wafer 620 may capture image data at a higher resolution than FSI image wafer 610. In one embodiment, the thickness of FSI image sensor wafer excluding color filters 650 and microlenses 655 is approximately 200 μm, and the thickness of BSI image sensor wafer 620, excluding color filters 630 and microlenses 635 is approximately 2 μm.

After the formation of color filters 630 and microlenses 635 on BSI image wafer 620, adhesive spacer 640 and cover glass 645 are installed to protect said microlenses, while color filters 650 and microlenses 655 are formed.

Figure 6B:
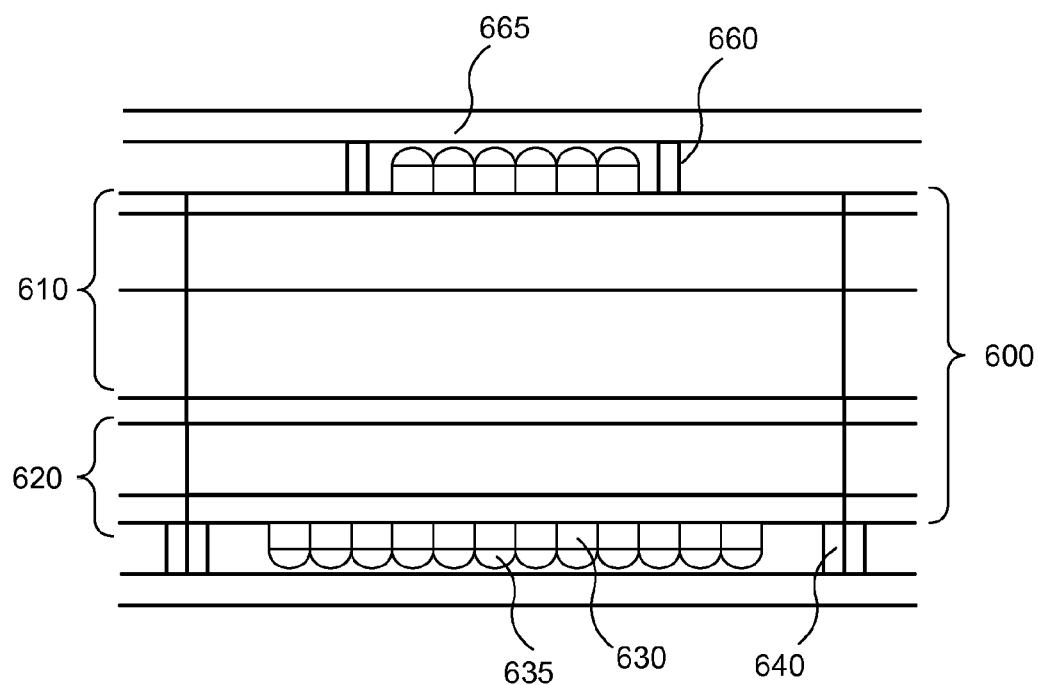

FIG. 6B is a cross-section view illustrating dual facing image sensor wafer 600 having a cover glass installed to protect microlenses 655 of FSI image wafer 610. In this embodiment, adhesive spacer 660 and cover glass 665 are installed over microlenses 655. As stated above, FSI image wafer 610 includes fewer pixels (and thus, fewer color filters and microlenses) than BSI image wafer 620. Thus, in this embodiment, cover glass 665 is formed to expose areas of the top metal of FSI wafer 610 not used by the FSI image sensor die. As described below, this area is to be utilized during the formation of a redistribution layer ("RDL").

Figure 6C:
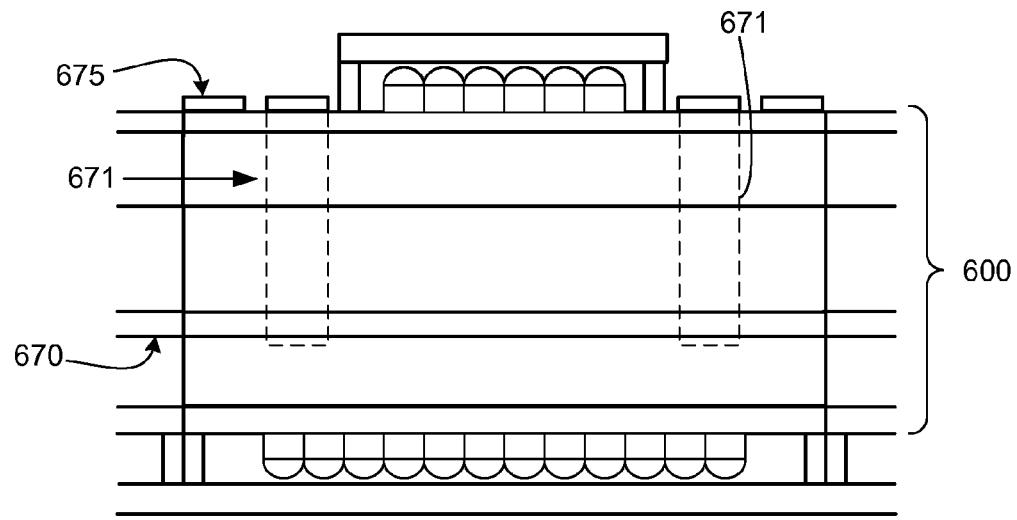

FIG. 6C is a cross-section view illustrating dual-facing image sensor wafer 600 after the formation of the RDL and TSV connections fabricated to couple the metal layer 670 of BSI image sensor die to metal pads 675. In this embodiment, a TSV process is used to form TSVs 671 which provide access to metal layer 670 of BSI image wafer 620. In other embodiments of the invention, CSP processes may be used to operatively couple metal layer 670 to metal pads 675. Dual-facing image sensor wafer 600 may be die sawed using known methods before or after metal pads 675 are formed.

Figure 6D:
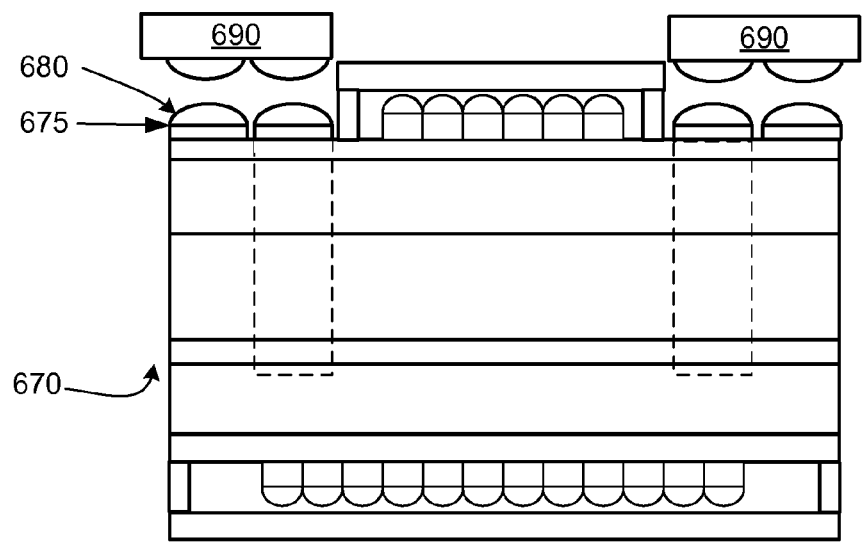

FIG. 6D is a cross-section view illustrating solder balls 680 which couple metal pads 675 to a substrate such as printed circuit board ("PCB") 690. Thus, PCB 690 may be operatively coupled to the metal layers of both FSI image sensor and BSI image sensor to control each imaging system and receive captured image data.

Figure 7:
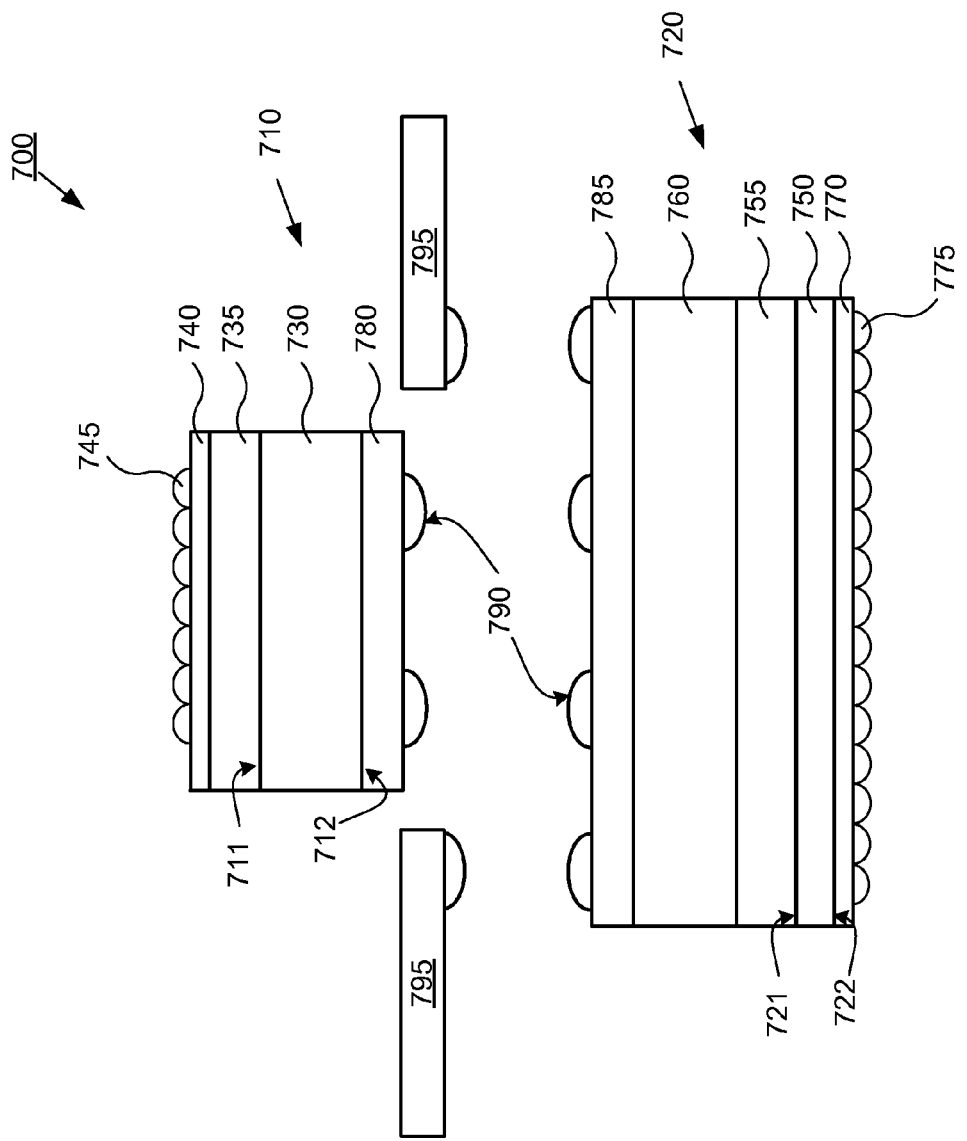
FIG. 7 is a cross-section view of a dual-facing camera assembly according to an embodiment of the disclosure.

FIG. 7 is a cross-section view illustrating a dual-facing camera assembly according to an embodiment of the disclosure. In this embodiment, dual-facing camera assembly 700 includes two package dies, FSI image sensor 710 and BSI image sensor 720. In contrast to dual-facing camera assembly 600, which was described as formed on the wafer-level with an FSI image sensor wafer bonded to a BSI image sensor wafer during fabrication, dual-facing camera assembly 700 comprises two packaged dies operatively coupled to a PCB substrate.

The photosensitive region of FSI image sensor 710 is formed under frontside 711 of substrate 730. In some embodiments of the invention, substrate 730 comprises an epitaxial layer. Metal stack 735 is formed on frontside 711 of substrate 730. Metal stack 735 includes one or more metal interconnect layers separated by dielectric layers. Color filter 740 is formed on metal stack 735 and microlens 745 is formed on color filter 740. RDL 780 (discussed below) is formed on backside 712 of substrate 730.

The photosensitive region of BSI image sensor 720 is formed under frontside 721 of substrate 750. In some embodiments of the invention, substrate 750 comprises an epitaxial layer. Metal stack 755 is formed on frontside 721 of substrate 750. Metal stack 755 comprises one or more metal interconnect layers separated by dielectric layers. Handle substrate 760 is bonded to substrate 750 before BSI image sensor 720 is die-sawed on the silicon wafer. A handle substrate is used as a handle to hold a partially fabricated imaging pixel while thinning its backside. Handle substrate 760 may be formed from a silicon wafer comprised of multiple handle substrate (alternatively referred to herein as a handle wafer) that is bonded to BSI image sensor 720 during fabrication. Color filter 770 is formed and microlenses 775 are formed on color filter 770. RDL 785 is formed on the frontside of BSI image sensor 720. Solder balls 790 are formed on the backside of RDL 780 and front side of RDL 785, and may be soldered to a substrate such as PCB 795.

In this embodiment, the thickness of dual-facing camera assembly 700 is greater than the thickness of dual-facing camera assembly 600 in FIG. 6D, since dual-facing camera assembly 700 uses a separate handle substrate for BSI image sensor 720 instead of using an FSI image sensor as the BSI image sensor's handle substrate (as described above).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An apparatus comprising:
    a first imaging system including a frontside illuminated (FSI) array of imaging pixels disposed within a first semiconductor die, wherein each FSI imaging pixel includes a photodiode region for accumulating an image charge in response to light incident upon a frontside of the FSI array of imaging pixels;
    a first metal stack disposed on a first side of the first semiconductor die and including FSI readout circuitry coupled to the first imaging system to readout image data from each of the FSI imaging pixels of the FSI array of imaging pixels;
    a second imaging system including a backside illuminated (BSI) array of imaging pixels disposed within a second semiconductor die, wherein each BSI imaging pixel includes a photodiode region for accumulating an image charge in response to light incident upon a backside of the BSI array of imaging pixels;
    a second metal stack disposed on the second semiconductor die and including BSI readout circuitry coupled to the second imaging system to readout image data from each of the BSI imaging pixels of the BSI array of imaging pixels; and
    a bonding layer to bond the second metal stack to a second side of the first semiconductor die.

2. The apparatus of claim 1, wherein the number of BSI imaging pixels of the BSI array of imaging pixels is greater than the number of FSI imaging pixels of the FSI array of imaging pixels.

3. The apparatus of claim 1, wherein a center of the first imaging system is relatively aligned with a center of the second imaging system.

4. The apparatus of claim 1, wherein the second imaging system comprises a thickness less than the first imaging system.

5. The apparatus of claim 1, wherein the first and second metal stacks are operatively coupled to a substrate to receive the image data from the FSI readout circuitry and the BSI readout circuitry.

6. The apparatus of claim 1, wherein the substrate to receive the image data from the FSI readout circuitry and the BSI readout circuitry comprises a printed circuit board (PCB).

7. The apparatus of claim 6, wherein the first semiconductor die comprises a silicon semiconductor material and includes at least one of thru-silicon via (TSV) to operatively couple the BSI readout circuitry of the second metal stack to the PCB.

8. The apparatus of claim 1, wherein the bonding layer comprises an oxide bonding layer.

9. The apparatus of claim 1, wherein the FSI array of imaging pixels includes, for each FSI imaging pixel:
    a microlens disposed on a frontside of the first semiconductor die below the photodiode region and optically aligned to focus light received from the frontside onto the photodiode region; and
    a color filter disposed between the microlens and the photodiode region to filter the light received from the frontside; and
    wherein the BSI array of imaging pixels includes, for each BSI imaging pixel:
    a microlens disposed on a backside of the second semiconductor die below the photodiode region and optically aligned to focus light received from the backside onto the photodiode region; and
    a color filter disposed between the microlens and the photodiode region to filter the light received from the backside.

10. An imaging system comprising:
    a frontside illuminated (FSI) array of imaging pixels wherein each FSI imaging pixel includes a photodiode region for accumulating an image charge in response to light incident upon a frontside of the FSI array of imaging pixels;

FSI readout circuitry disposed on the FSI array to readout image data from each of the FSI imaging pixels;

a backside illuminated (BSI) array of imaging pixels wherein each BSI imaging pixel includes a photodiode region for accumulating an image charge in response to light incident upon a backside of the BSI array of imaging pixels, wherein a center of the BSI array of imaging pixels is relatively aligned with a center of the FSI array of imaging pixels;

BSI readout circuitry disposed on the BSI array to readout image data from each of the BSI imaging pixels; and a substrate operatively coupled to the FSI readout circuitry and the BSI readout circuitry to receive image data from the FSI array of imaging pixels and the BSI array of imaging pixels.

11. The imaging system of claim 10, wherein the substrate comprises a printed circuit board (PCB).

12. The imaging system of claim 10, wherein the BSI array of imaging pixels is included in a semiconductor die, the BSI readout circuitry is included in a metal stack disposed on the semiconductor die, and the imaging system further comprises a handle substrate disposed on the metal stack.

13. The imaging system of claim 12, wherein the BSI array of imaging pixels comprises a thickness less than the FSI array of imaging pixels.

14. The imaging system of claim 10, wherein the number of BSI imaging pixels of the BSI array of imaging pixels is greater than the number of FSI imaging pixels of the FSI array of imaging pixels.

15. The imaging system of claim 10, wherein a width of the FSI array of imaging pixels is relatively equal to a width of the BSI array of imaging pixels.

* * * * *